United States Patent
Briggs et al.

(10) Patent No.: US 9,559,107 B2
(45) Date of Patent: Jan. 31, 2017

(54) STRUCTURE AND METHOD FOR BEOL NANOSCALE DAMASCENE SIDEWALL-DEFINED NON-VOLATILE MEMORY ELEMENT

(71) Applicant: International Business Machines Corporation, Armonk, NY (US)

(72) Inventors: Benjamin D. Briggs, Waterford, NY (US); Lawrence A. Clevenger, LaGrangeville, NY (US); Michael Rizzolo, Red Hook, NY (US)

(73) Assignee: International Businesss Machines Corporation, Armonk, NY (US)

( * ) Notice: Subject to any disclaimer, the term of this patent is extended or adjusted under 35 U.S.C. 154(b) by 0 days.

(21) Appl. No.: 14/717,236

(22) Filed: May 20, 2015

(65) Prior Publication Data
US 2016/0343721 A1 Nov. 24, 2016

(51) Int. Cl.
*H01L 47/00* (2006.01)
*H01L 27/115* (2006.01)
*H01L 29/423* (2006.01)

(52) U.S. Cl.
CPC ..... *H01L 27/11521* (2013.01); *H01L 29/4236* (2013.01)

(58) Field of Classification Search
None
See application file for complete search history.

(56) References Cited

U.S. PATENT DOCUMENTS

| | | | |
|---|---|---|---|
| 6,346,478 B1 | 2/2002 | Pyo et al. | |
| 7,166,533 B2 | 1/2007 | Happ | |
| 7,745,282 B2 | 6/2010 | Yang et al. | |
| 8,399,353 B2 | 3/2013 | Ishizaka et al. | |
| 8,859,422 B2 | 10/2014 | Ishizaka et al. | |
| 2001/0041404 A1* | 11/2001 | Uchiyama | H01L 27/10888 438/253 |
| 2007/0018240 A1* | 1/2007 | Chindalore | B82Y 10/00 257/330 |
| 2007/0020820 A1* | 1/2007 | Chindalore | B82Y 10/00 438/142 |
| 2007/0045699 A1* | 3/2007 | Liao | H01L 29/66181 257/301 |
| 2009/0321247 A1 | 12/2009 | Cerio, Jr. et al. | |
| 2012/0241710 A1* | 9/2012 | Liu | H01L 27/2472 257/4 |

(Continued)

*Primary Examiner* — David E Graybill
(74) *Attorney, Agent, or Firm* — Whitham, Curtis & Cook, PC; Steven J. Meyers

(57) ABSTRACT

An exposed edge of a conductive liner in a Damascene trench provides a high aspect ratio geometry of a non-volatile memory cell that can be scaled to arbitrarily small and nanoscale areas and thus provides an extremely compact non-volatile memory array layout that is applicable to any non-volatile memory technology such as resistive memory (RRAM), magnetic memory (MRAM), phase change memory (PCRAM) and the like. The high aspect ratio of the non-volatile memory cell area offsets the sharp increase in filament forming voltage required in conductive bridge memories (CBRAMs) as the non-volatile memory cells are scaled to very small sizes. The compact memory cell layout is also tolerant of lithographic overlay errors and provides a high degree of uniformity of electrical characteristics which are tunable by maskless and non-lithographic processes.

17 Claims, 17 Drawing Sheets

(56) References Cited

U.S. PATENT DOCUMENTS

2015/0016174 A1* 1/2015 Liu .................. H01L 27/11206
                                                        365/96
2016/0218283 A1* 7/2016 Trinh ..................... H01L 45/08

* cited by examiner

STRUCTURE AND METHOD FOR BEOL NANOSCALE DAMASCENE SIDEWALL-DEFINED NON-VOLATILE MEMORY ELEMENT

FIELD OF THE INVENTION

The present invention generally relates to non-volatile memory structures and, more particularly, to forming non-volatile memory cells and connections thereto at sub-lithographic dimensions and with high uniformity of resulting electrical characteristics.

BACKGROUND OF THE INVENTION

Numerous practical considerations have driven semiconductor integrated circuit designs to smaller size regimes and minimum feature dimensions and higher integration densities of electronic elements. In logic circuits and processors, smaller element size allows increased functionality to be developed on a chip of given area. Increased element integration density allows reduction in signal propagation time and increased noise immunity due to shorter interconnection lengths. In memory devices, reduced memory element size and increased integration density provides much the same benefits as well as greater memory capacity and decreased manufacturing process costs per memory element or cell.

Depending on the performance requirements (e.g. access time) and operating conditions (e.g. power and refresh requirements, if any), many types of memory elements have been designed and fabricated. An important type of memory element is one capable of storing data for long periods of time without any requirement for power other than at times data is being written, erased or read. Such memory elements or cells are referred to as being non-volatile (NV) and memories containing such non-volatile memory elements or cells are referred to, simply, as NV memories. An early type of NV cell included a field effect transistor with an insulated or floating gate such that a high voltage applied across the insulator caused tunneling of electrons to or from the floating gate. The memory cell could be read by applying a lower voltage to another gate to induce an electrical field in the transistor channel with the floating gate interposed therebetween. The resulting electrical field in the transistor which would be enhanced (or reduced, depending on transistor conductivity type) by charge storage on the floating gate would and thus cause differences in the conduction of the transistor channel which could be read to determine if charge had been stored in the floating gate.

While such NV memories using floating gate transistors were highly successful, the formation of transistors with floating gates required complex and expensive manufacturing processes and were subject to a significant degree of lack of uniformity in electrical characteristics of such transistors on a chip; reducing manufacturing yield and increasing manufacturing costs per chip. Also, the degree of possible size reduction and integration density was limited by lithographic exposure resolution and, importantly, the tunneling effect upon writing or erasure caused small but finite damage to the insulation of the floating gate; limiting the number of times a given memory cell could be written or erased and leading to charge leakage and loss of the data stored therein.

While these drawbacks were not particularly severe where write and erase operations were performed only infrequently, these drawbacks have led to the exploitation of other phenomena to avoid them. One phenomenon that has been exploited using an electrochemically active electrode such as copper or silver migration within an insulating material to form conductive filaments of the active electrode material. Another phenomenon that has been exploited in this manner does not require an electrochemically active electrode material and the filament is formed by oxygen vacancy motions. In this mechanism, the oxygen vacancies can agglomerate at grain boundaries within a metal oxide insulator and locally create metal-rich filaments.

When filaments are grown, they essentially become fuses that can be ruptured by joule heating in response to a high current and re-grown by a voltage significantly less than the voltage used to initially form them since the short distance of the discontinuity of a ruptured filament increases the electric field across the discontinuity. This reversible process provides high performance NV memory cells operable in much the same fashion as the two phenomena alluded to above but using other materials and other physical mechanisms. It has been found that, in either the ruptured or re-grown state, the filaments (and discontinuities) are extremely stable over time and a wide range of environmental conditions and require no power to maintain. Among the few drawbacks of such a device are that the voltage required to initially form the filaments may be large enough to present criticality in supplying sufficient current to the memory cells during manufacture and an observed lack of uniformity of electrical characteristics of memory cells on a chip during filament growth. Methods exist for providing some reduction in the voltage required for filament formation but at the cost of dielectric film density modification or special oxygen exchange layers, adding process complexity. Additionally, scaling of such devices to smaller sizes has been lithographically limited.

SUMMARY OF THE INVENTION

It is therefore an object of the present invention to provide a compact and potentially sub-lithographic connection arrangement usable to increase integration density in non-volatile memory cell arrays as well as a structure by which NV memory cells can be formed at sub-lithographic sizes, regardless of NV memory cell technology or the mechanism of filament development.

It is another object of the invention to provide a non-volatile memory cell device in which the voltage required for filament formation does not vary significantly with area and in which overlay error does not cause significant variation in memory cell area or variation in electrical characteristics between memory cells.

It is a further object of the invention to provides a universal sub-lithographic memory cell structure in which memory cells are formed and connected at a minimum feature and critical dimension size far smaller than can be defined lithographically.

In order to accomplish these and other objects of the invention, a non-volatile memory device is provided comprising a conductive liner in a each of at least two trenches formed in a body of insulating material, a conductive dual top electrode overlying an edge of the conductive liner in the at least two trenches and connected to a conductor, and a body of dielectric material formed between an edge of the conductive liner and the conductive dual top electrode, the edge of the conductive liner, the body of dielectric material and respective portions of the conductive dual top electrode form two non-volatile memory cells, whereby a thickness of the conductive liner determines one dimension of an area of at least one of the two non-volatile memory cells.

In accordance with another aspect of the invention, a method of tuning dimensions of a non-volatile memory cells provided comprising steps of controlling thickness of a conductive liner in a trench in a body of insulating material, forming and recessing a conductor within the trench, filling a remainder of the trench with insulating material, exposing an edge of the conductive liner, and forming a body of patterned dielectric material and a patterned electrode overlapping the edge of the conductive liner whereby the thickness of the conductive liner determines one dimension of the non-volatile memory cell.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
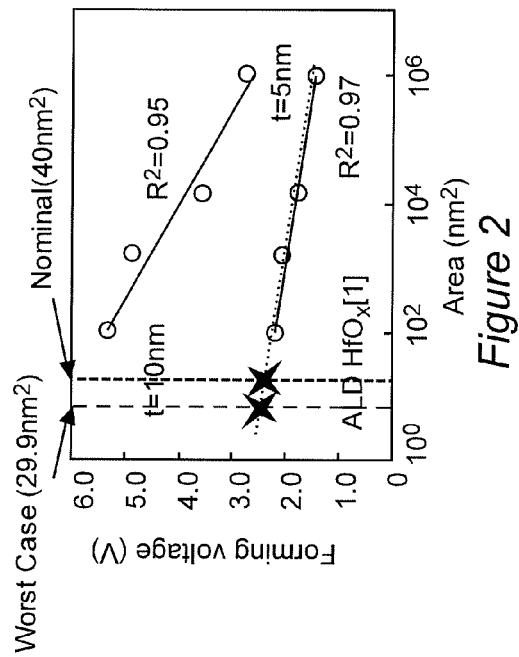
FIG. 1 graphically illustrates the phenomenon exploited by the invention to provide a non-volatile memory cell.

Referring now to the drawings, and more particularly to FIG. 1, there is shown an exemplary, highly simplified cross-sectional view of a memory cell exploiting the phenomenon of voltage-induced filament growth in different states and a diagram of applied voltages and currents required to transition between the respective illustrated memory cell states. It should be clearly understood that initial filament growth and filament rupture and re-growth are essentially the same although different physical phenomena and/or materials may be employed. Therefore the invention, as will be described in detail below, is applicable to all types of NV memory cells employing filament rupture and re-growth, regardless of the phenomena exploited or physical processes involved.

The initial state is the state in which the memory cell is manufactured and prior to the application of any voltage thereto. In this initial state the memory device comprises a thickness of dielectric material 10, preferably having a high dielectric constant, referred to as a Hi-K material, an upper conductive material layer or electrode 20, preferably titanium nitride (TiN) although any conductive material such as copper, nickel, platinum, and the like is suitable, and a lower conductive material layer 30, preferably of tantalum nitride (TaN). Such a structure is referred to as a metal-insulator-metal (MIM) structure or cell and corresponds to a cell exploiting the second physical mechanism alluded to above although the invention is equally applicable to the cells operating by the first physical mechanism or other foreseeable mechanisms of filament manipulation. Other materials can be used for conductive material layers 20, 30. Hi-K material 10 may be any insulating material having a dielectric constant greater than about four although some other dielectric materials having a lower dielectric constant are suitable. Dielectric materials containing metal oxides are particularly preferred.

The density of the particular material used will significantly affect filament geometry and filament thickness and consequent resistance. A preferred Hi-K material is thus amorphous hafnium oxide ($HfO_x$) having a density that provides a favorable trade-off between required current for filament formation and write and erase operations and mechanical and/or electrical robustness of filaments. Other Hi-K materials having a similar density are known and may be used in the invention. Silicon oxide, tantalum oxide, titanium oxide and some other similar materials can also be used.

If a relatively high voltage is applied across the device in its initial state, conductive filaments 40 are grown through the dielectric or Hi-K material and connect the conductive layers 20 and 30 and the memory cell is thus formed as indicated by the state legend "forming" and a current will begin to flow as shown by arrow 1 in the voltage/current diagram to the left in FIG. 1, causing the voltage to drop to a relatively low level indicating that the filaments and the memory cell have been adequately and successfully formed allowing the current to be decreased. If the current is then increased above this reduced level (causing a voltage increase as shown by arrow 2 in the voltage/current diagram, joule heating of the filament(s) will cause a rupture 50 causing reset of the memory cell as indicated in the cross-section having the legend "Reset" and the current will fall to zero (or cause a large resistance increase) indicating completion of the reset operation.

If the voltage is then increased again but to a level below that required for the forming step, the filament(s) will be regrown across the rupture as indicated at 60 and current can again flow through the memory cell and cause the voltage to again fall to a low level for a given current as indicated by arrow 3 in the voltage/current diagram and the memory cell will be "Set". The memory cell can then be reset by increasing current to rupture the filament(s) as before. From experimental results to date, it appears that the set and reset cycle can be performed many millions if not billions of times without memory cell degradation. Memory cells having such a construction are referred to by the general term resistive memory or ReRAM; which term comprehends similar memories that do not form filaments but still alter resistance (to which the invention is also equally applicable, or the more specific term conductive bridge memory or CBRAM which is specific to memory cells where filaments are ruptured and re-grown.

Figure 2:
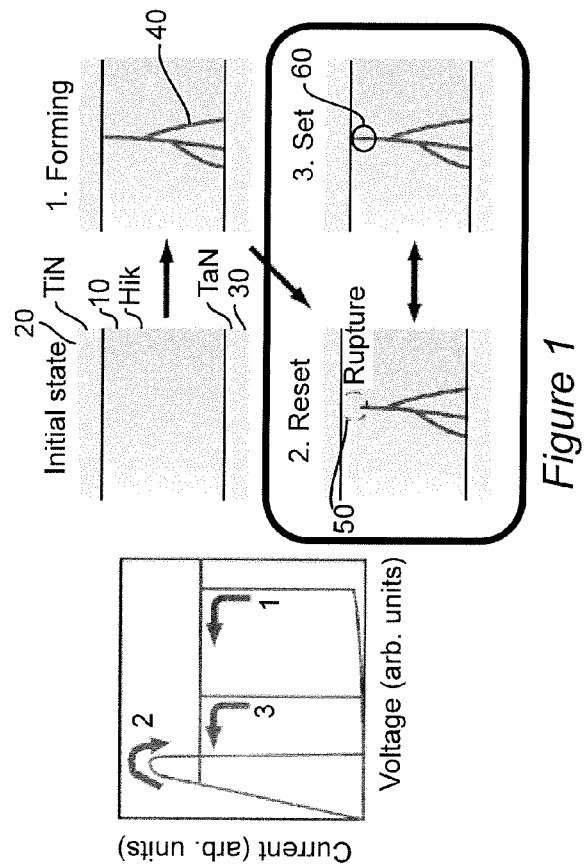
FIG. 2 shows a graphical comparison between the invention and similarly constructed and operated memory cells that do not form filaments.

Referring now to FIG. 2, the inventors have found that the area of a CBRAM cell has a profound effect on the voltage required for initial formation of the filament(s), particularly when the NV memory cell is scaled to small sizes, and that the required voltage is also affected by the aspect ratio of the CBRAM cell. FIG. 2 represents experimental data using a memory cell having a geometry similar to that of the invention which will be discussed in greater detail below. Specifically, the CBRAM cell in accordance with the invention has a high aspect ratio in plan view defined by the edge of a layer of conductive material having a thickness of either 5 nm or 10 nm or less. Therefore, the upper trace fitted through the experimental data points has an aspect ratio of one-half the aspect ratio of the lower trace for a corresponding area. The Hi-K material is $HfO_x$ deposited by atomic layer deposition to form a very thin and highly uniform layer. The two lines fitted to the experimental data with substantially equivalent accuracy ($R^2$) correspond to the voltages required to form conductive filaments through the Hi-K material for different CBRAM cell areas. It can be seen that, at the very small area regimes of interest, required voltage increases with area reduction and, perhaps more importantly in regard to the invention, increases more sharply with area reduction for lower aspect ratios of CBRAM cell area. Therefore, high aspect ratios are favored both for reducing the required filament forming voltage at the area regimes of interest.

Figure 3:
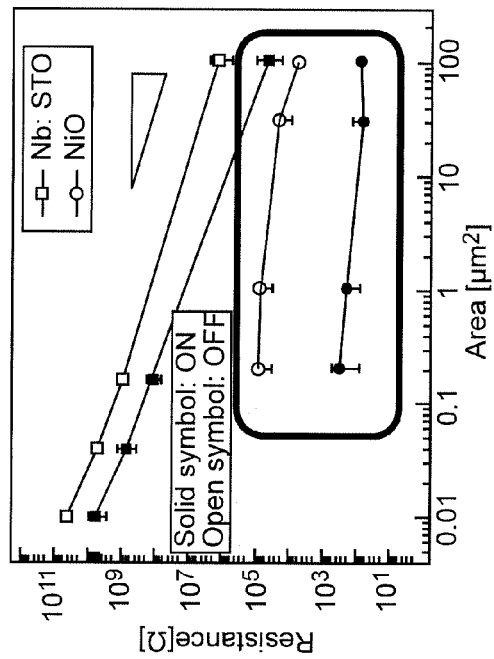
FIG. 3 illustrates a comparison between effects of storage cell area on the filament forming voltage.

These advantages are not available from ReRAM cells that do not form filaments as shown in FIG. 3 which compares resistance values of the storage state of CBRAMs and ReRAMs that do not form conductive filaments. The upper traces in FIG. 3 correspond to on and off storage states, respectively, of a ReRAM cell generally constructed as discussed above using a niobium and strontium titanate (Nb:STO) mixture for the Hi-K dielectric which changes resistance but does not form conductive filaments. The lower traces correspond to a CBRAM cell constructed as discussed above using NiO as a suitable alternative to the preferred $HfO_x$ as the Hi-K material. It can be seen that the resistance between storage states (plotted on a logarithmic scale) is not only much lower for the CBRAM as compared with a ReRAM that does not form filaments but the resistance ratio between storage states is also much larger and thus more easily detectable and both resistance and resistance ratio are more nearly constant for the CBRAM cell as memory cell area is reduced. Therefore, filament geometry is seen to dominate over area and electrical characteristics of CBRAM cells, especially memory cells having a high aspect ratio, and are substantially area-independent in the area regimes of interest.

Accordingly, it can be concluded that CBRAM cell geometries having a very high aspect ratio and very small area are favored for NV memory cells. Such a geometry that also provides additional advantages can be obtained in accordance with the preferred manufacturing process sequence of the invention and the resulting structure which will now be explained in connection with FIG. 4-13. Other or variant process sequences and/or different materials will be apparent to those skilled in the art from the following discussion, as well.

Figure 4:
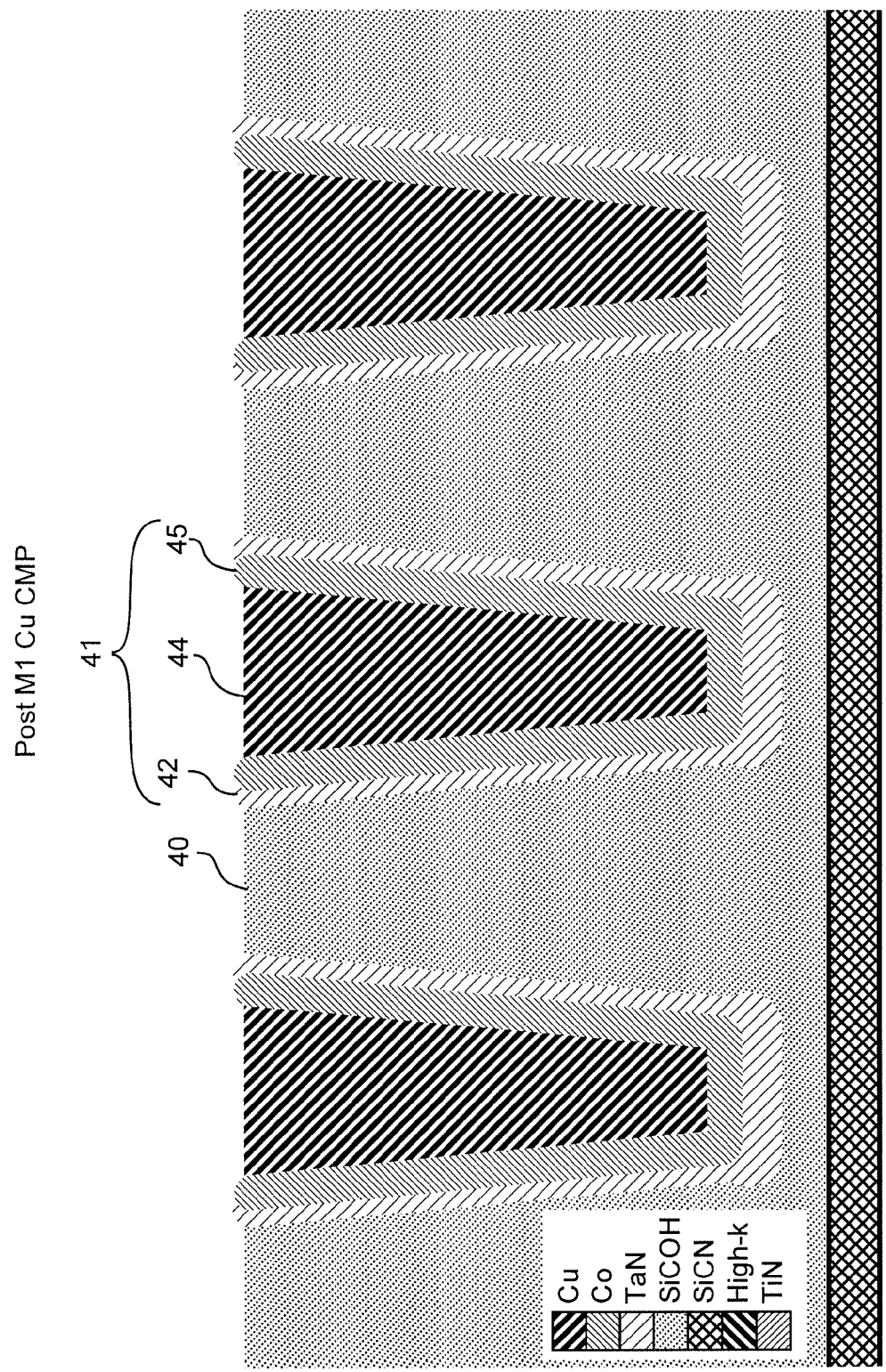
FIGS. 4, 5, 6, 7, 8, 9, 10, 11, 12 and 13 are cross-sectional views of process steps in formation of the memory device including two memory cells.

Referring now to FIG. 4, an early stage in the process sequence is shown. An insulating substrate or layer 40 on a substrate of substantially arbitrary insulating material. A preferred material for substrate or layer 40 is referred to as SiCOH; which term is not scrupulously accurate but rather is a known silicon oxide dielectric containing carbon and hydrogen. However, it should be understood that any low-K dielectric will suffice for practice of the invention. As depicted, this substrate or layer has been previously processed by etching trenches 41 therein, lining the trenches with tantalum nitride (TaN) 42, a standard material to provide increased adhesion and a diffusion barrier for copper and a further lining layer 43 of cobalt. The thickness of this layer is preferably very small and generally in the range of 2 nm to 10 nm; a dimension far smaller than can be formed or defined lithographically and which can be freely varied to trim or tune the areas of the eventually resulting NV memory cells without any requirement for a mask or other lithographic process. The remainder of the volume of the trenches 41 is filled with copper (Cu) 44. This process is familiar to those skilled in the art and is referred to as a Damascene process which is favored for developing structures that are resistant to migration of the copper fill which functions as a bit line, maintaining a constant geometry of materials within the trench during thermal cycling or simply increasing mechanical robustness. Damascene processes are also favored to provide increased fidelity of semiconductor and conductor shapes to a design since etching of a crystal lattice structure may be performed with better dimensional accuracy than patterning of a deposited thin layer of material. This enhanced shape fidelity may be exploited to increase integration density in device designs.

Figure 5:
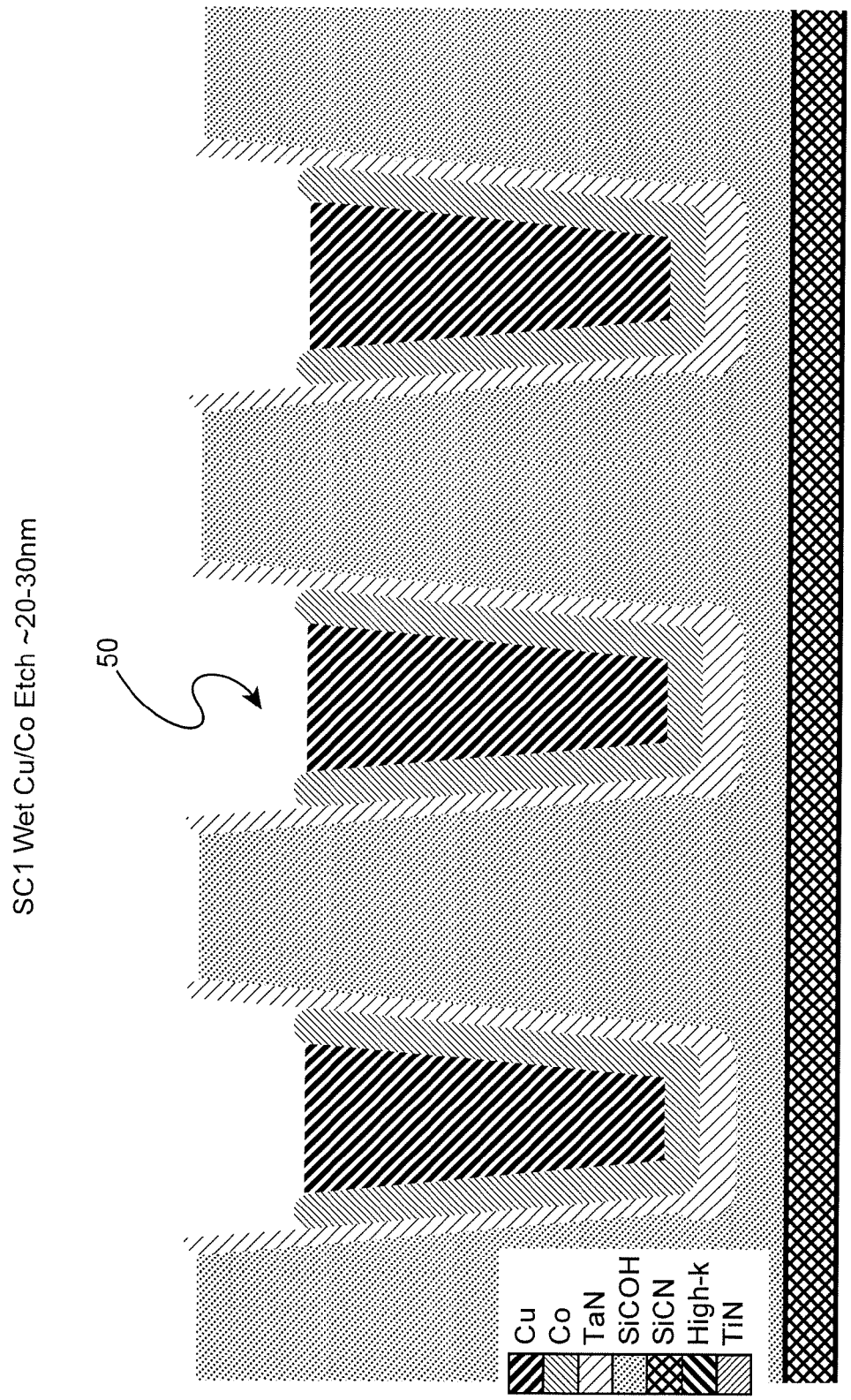
Figure 6:
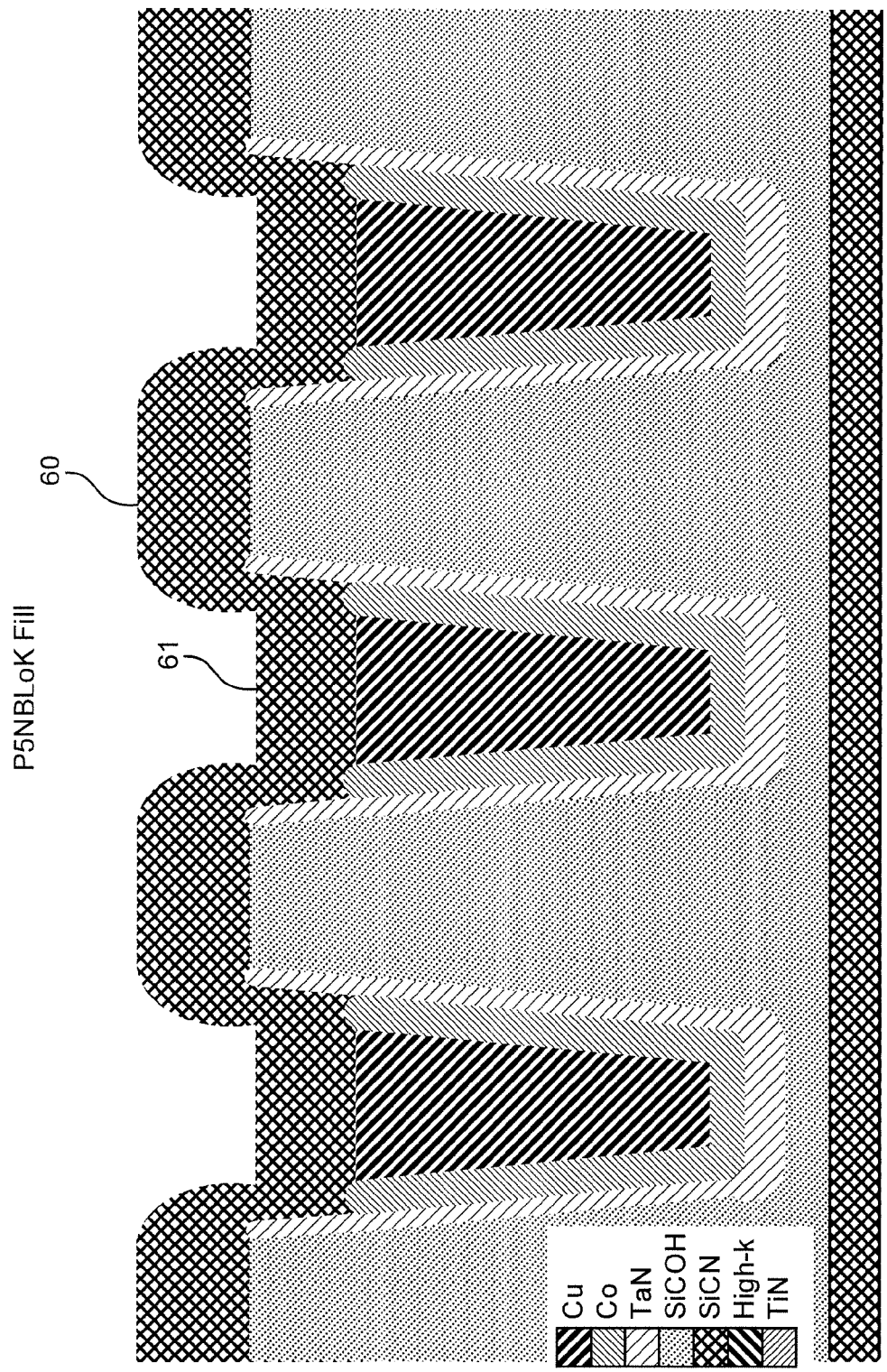
Figure 7:
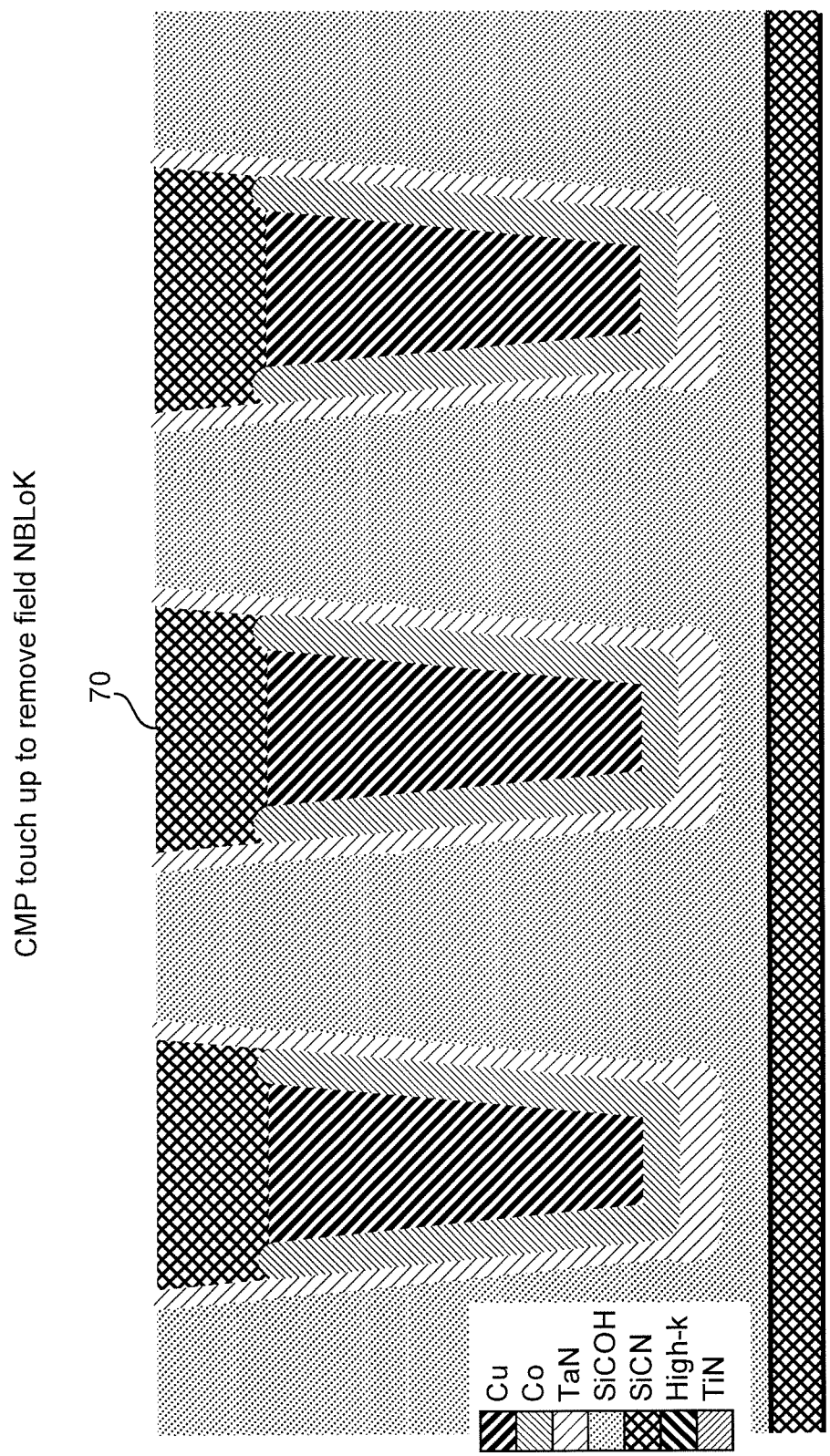

Then, as shown in FIG. 5 the copper and cobalt are recessed 20 nm to 30 nm by etching to form recesses 50, preferably using a timed wet etch. A preferred etchant is a wet cleaning process using a solution of ammonia hydroxide and hydrogen peroxide but any etchant which is selective to tantalum nitride is suitable. A blanket layer 60 of silicon-carbon nitride insulating film is then anisotropically deposited to a thickness at least equal to the depth of recess 50, as shown in FIG. 6 at 61. The resulting structure is then planarized, preferably using chemical-mechanical polishing (CMP), as shown in FIG. 7 leaving plugs 70. The resulting surface thus has very thin lines of exposed TaN formed by edges of the trench liner 42 supported on opposite sides by insulating material.

Figure 8:
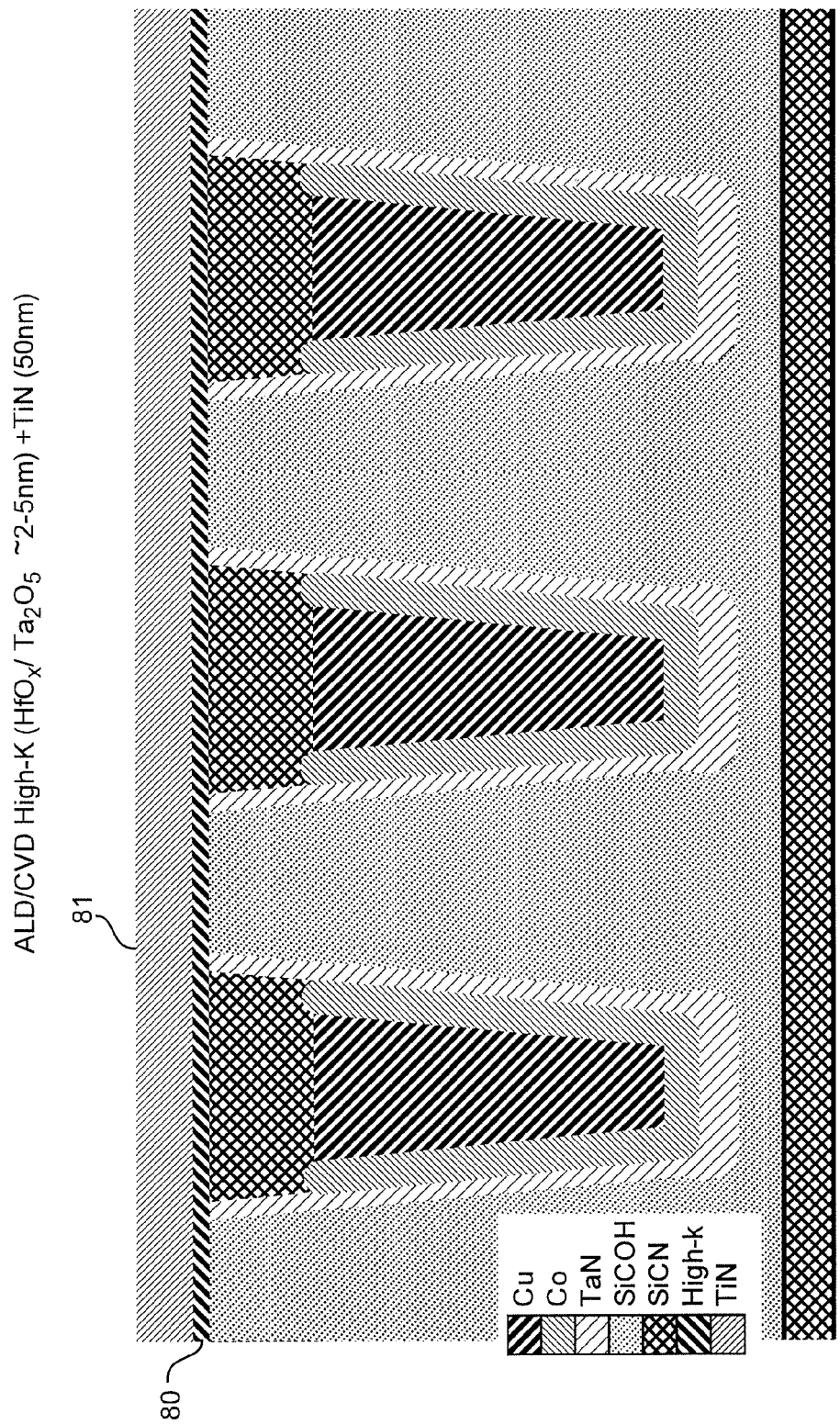
Figure 9:
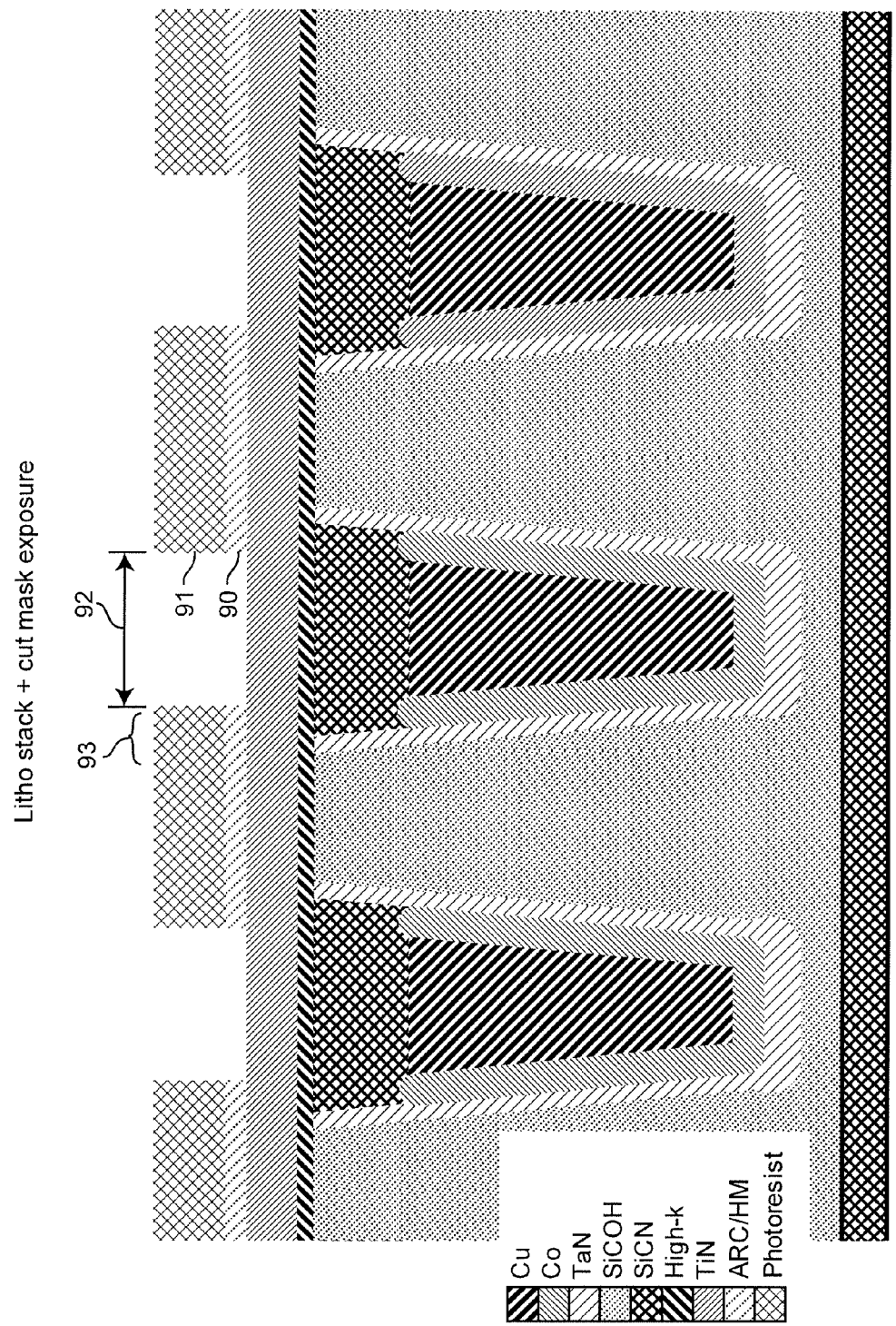
Figure 10:
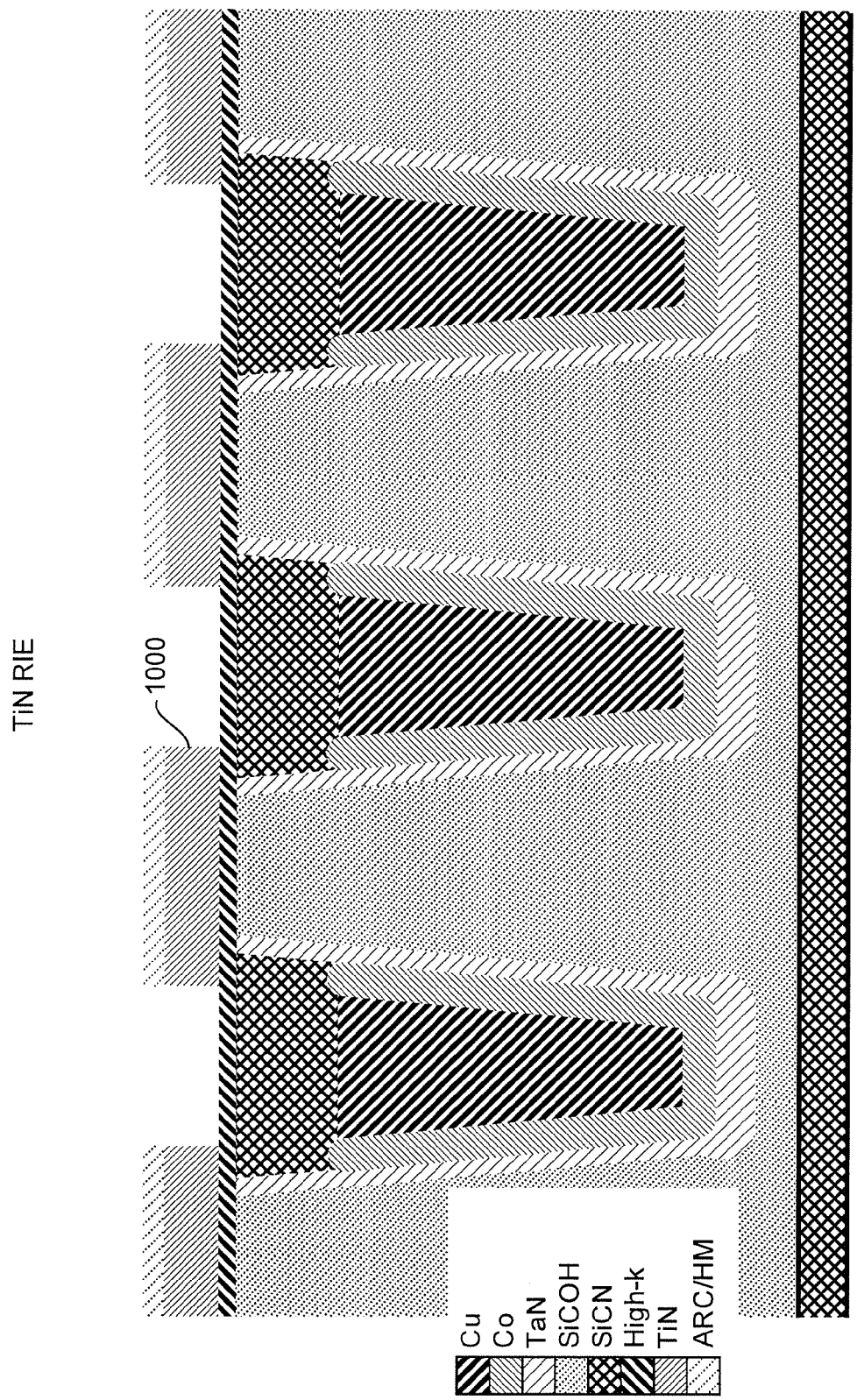
Figure 11:
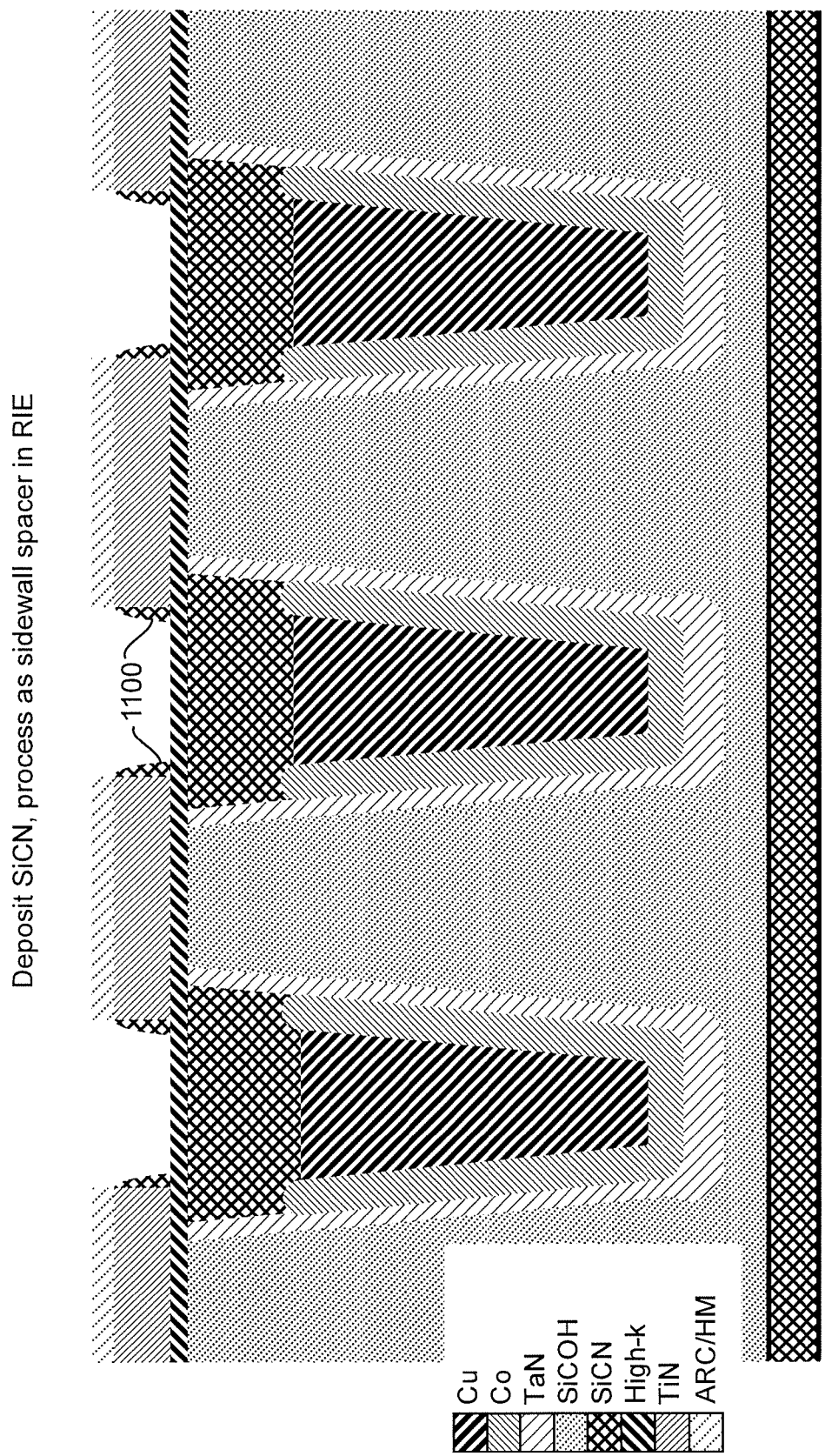
Figure 12:
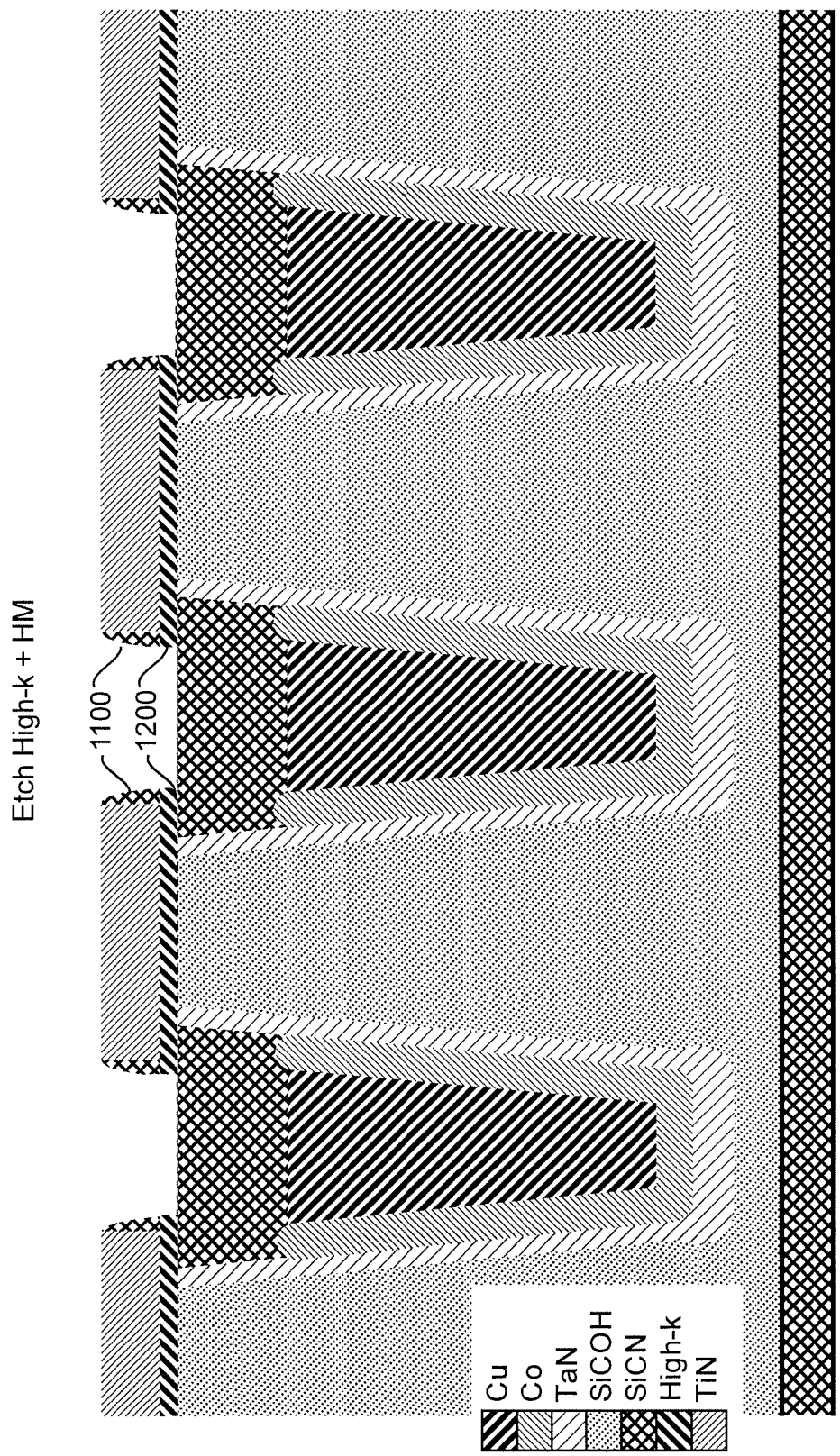
Figure 13:
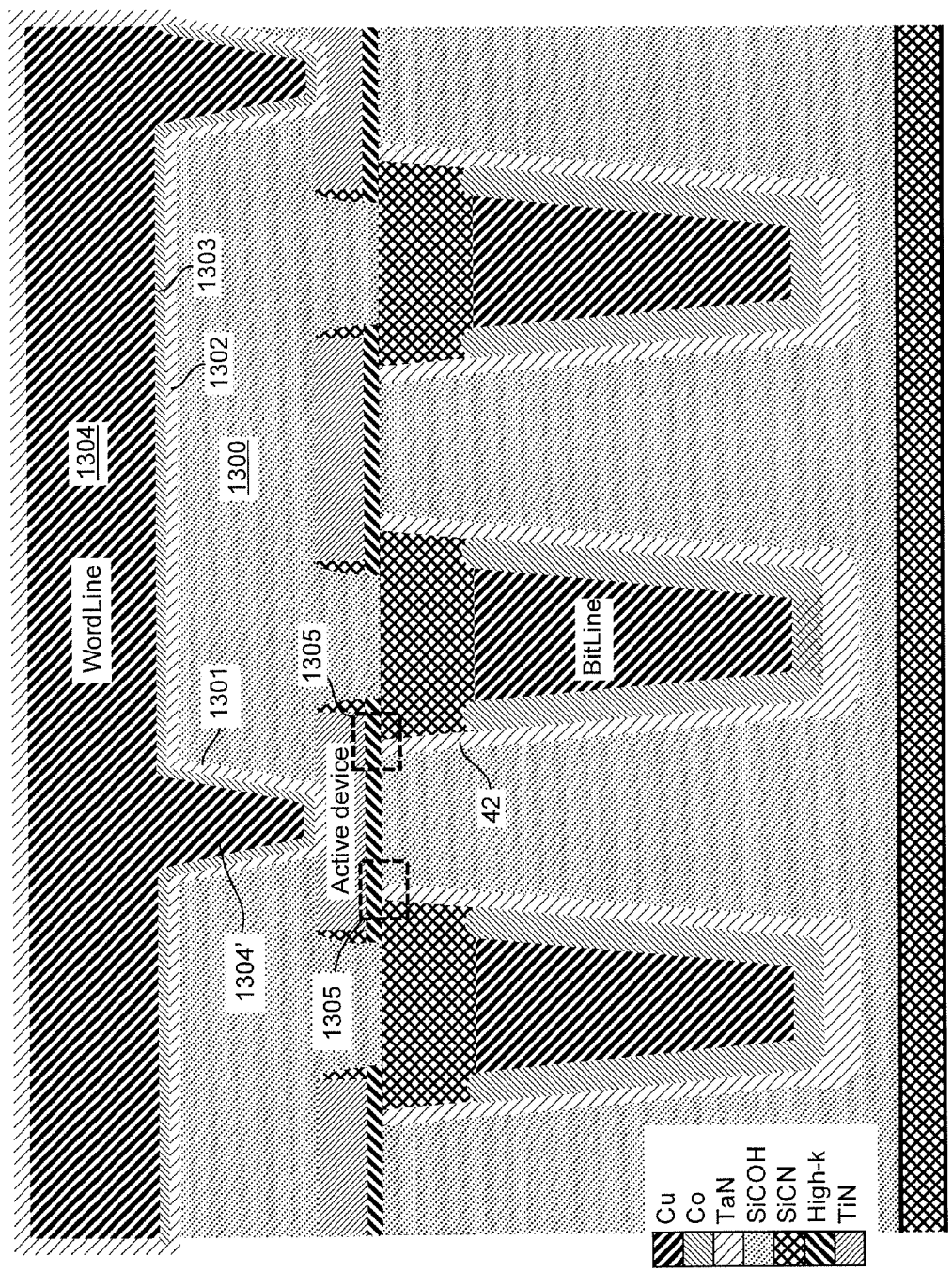

Continuing with FIG. 8, a 2 nm to 5 nm thick layer 80 of Hi-K material, preferably of $HfO_x$ but other dielectrics as described above or layers of several different dielectrics such as oxides of tantalum, titanium, nickel or copper can be used, is deposited by atomic layer deposition (ALD) or physical vapor deposition (PVD) at a high temperature followed by a thicker (e.g. 50 nm) layer of any electrode material such as titanium nitride (TiN) as shown in FIG. 8. These layers may be followed, as shown in FIG. 9, by a lithography stack including an organic or optical planarization layer followed by an optional anti-reflective coating (ARC) layer 90, which is preferred for lithography at or near the limits of lithographic resolution. The lithography stack is followed by a suitable resist 91 and patterned to form openings aligned with trenches 41 but having a width 92 and location to overlap the edges thereof by a small distance 93 at least equal to the thickness of exposed liner layer 42, which, as will be explained below, is not critical to the practice of the invention but relates to engendering tolerance for overlay error which is an incidental advantage of the preferred embodiment of the invention. The TiN is then etched as shown in FIG. 10, preferably using the Hi-K material as an etch stop and using any of a large number of suitable wet or dry etch processes, to form separated structures 1000 that are referred to as dual top electrodes, after which sidewall spacers 1100, preferably of silicon-carbon nitride insulator (to prevent a leakage path) are formed on the sides of the remaining TiN structures by a sequence of an isotropic deposition follow by a generally anisotropic etch. The Hi-K or other dielectric material is then etched in accordance with the spacers 1100 as shown at 1200 in FIG. 12. It should be appreciated that the width or thickness of the spacers can be controlled during the deposition and etching process sequence to closely control the dimensions of the patterned dielectric without use of a separate mask or other lithographic process. To essentially complete the CBRAM structure in accordance with the preferred embodiment of invention, a blanket layer 1300 of insulator, preferably SiCOH, is deposited and word line trenches and contact vias 1301 etched to TiN dual top electrode 1000 in a dual-Damascene process and lined with sequential layers of TaN (1302) and Co (1303 as before and the trenches 1301 and vias filled with Cu (1304, 1304'). The active CBRAM cells are thus formed where the Hi-K material contacts the TaN liner 41 of the bit line trenches and the size/area of the CBRAM cells can be readily tuned and made as small as desired by the TaN liner 41 thickness in one direction (horizontally and parallel to the page, as illustrated) and in an orthogonal direction (into and out of the plane of the page) by the width of dielectric spacers 1100; both by non-lithographic processes which can thus produce CBRAM cells of controllable and highly uniform electrical characteristics and at dimensions well below dimensions that can be lithographically resolved but well within current manufacturing capabilities. The principal tuning is performed by control of the thickness of TaN liner layer 42 which can be controlled very accurately and made very thin at the top of the bit line trenches and a thickness of 1 nm to 2 nm is easily achieved with high-quality films.

In fact, two sub-lithographic CBRAM cells are formed for each TiN dual top electrode structure 1000 which may be of minimum lithographic feature size and can be readily visualized from the plan views of FIGS. 17-19 that will be discussed below. It is also important to note that such tuning can be performed without any requirement for a lithographic mask and, as will be discussed in greater detail below, can be applied to any known or foreseeable NV memory cell technology to form a very compact connection structure and cell array.

Figure 14:
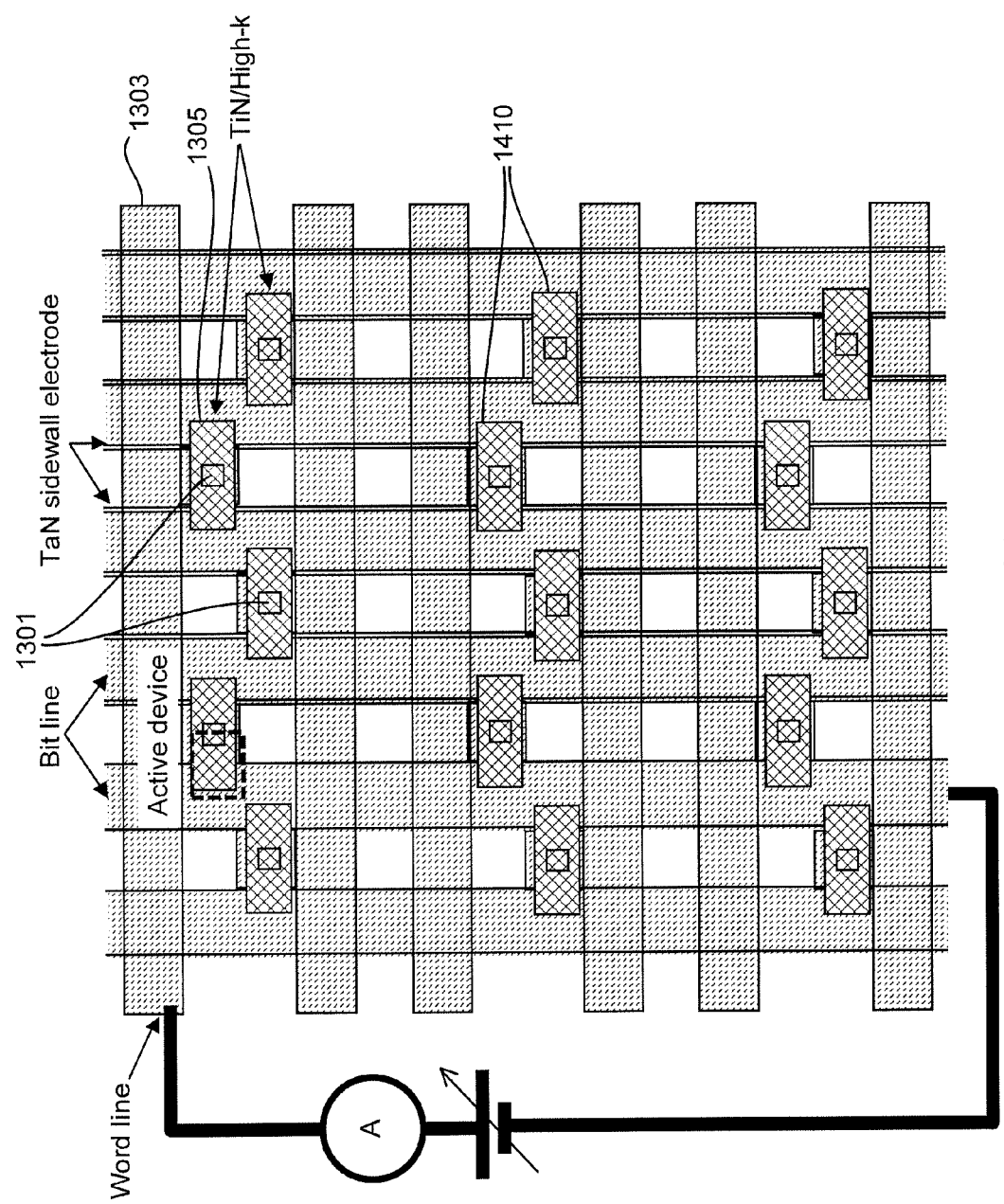
FIGS. 14, 15 and 16 are plan views of alternative memory chip layouts in which the memory device in accordance with the invention may be employed.
Figure 15:
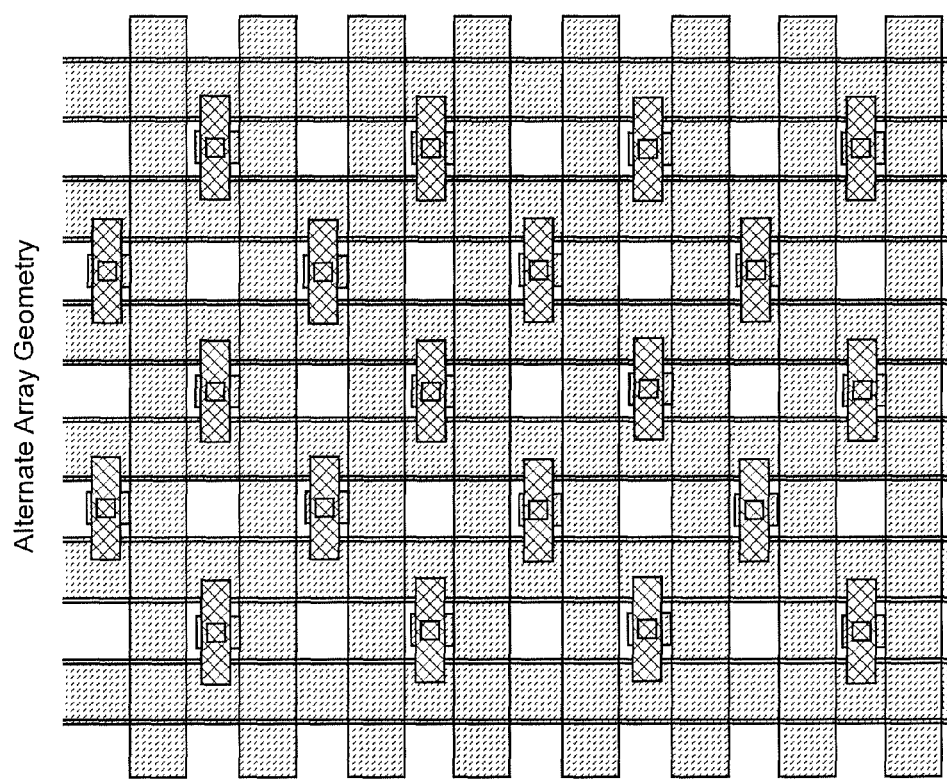
Figure 16:
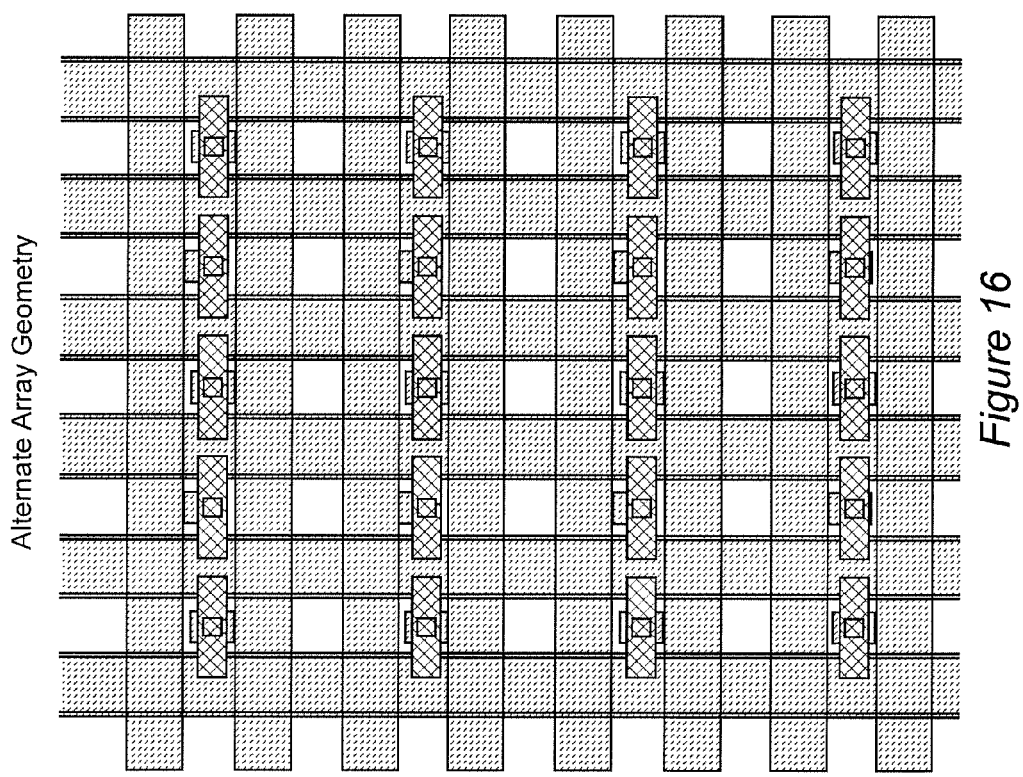

Referring now to FIGS. 14-16, three exemplary memory cell array layouts to which the connection structure in accordance with the invention is particularly applicable will be discussed. While not evident in the cross-sectional views of FIGS. 4-13 (which do not depict planar sections of the preferred structure but, rather, multiple planes in order to facilitate an understanding of the invention), it is seen from FIGS. 14-16 that the word lines 1304 (depicted as running horizontally in these Figures) are not simply linear connections but have extensions or tabs extending orthogonally therefrom at intervals in order to extend over the TiN dual top electrode structures 1000 where a connection thereto can be made with a via 1304'. This type of connection allows the word lines to be spaced in a manner that is favorable for lithography at extreme integration density and which reduces capacitive coupling between word lines to improve reliability of operation.

The memory cell array of FIG. 14 provides tabs or extensions 1410 on only one side of each word line 1303 and pairs of memory cells corresponding to dual top electrodes 1305 and contact vias 1301 are staggered along the bit lines. Thus, the memory cell array is not maximally compact. However, such an arrangement provides good noise immunity and heat dissipation.

The memory cell array illustrated in FIG. 15 is about 33% more compact and provides 25% more memory cells in a given area than the memory cell array of FIG. 14. This array layout also provides equal spacing between all pairs of memory cells at the same minimum lithographic feature size. Moreover, the equal spacing favors so-called split-pitch lithography for increased integration density and potentially reduces non-uniformity of etching processes across a chip, sometimes referred to as RIE lag due to localized loading of an etchant with reaction products.

The memory cell array illustrated in FIG. 16 interleaves tabs or extensions from a single side of each word line of word line pairs and provides linear alignment of memory cell pairs. This memory cell layout is equally compact as the array layout of FIG. 15 and is more tolerant of overlay error for formation of word lines and vias 1304, 1304' for connection to the TiN dual top electrodes 1000.

Referring again to FIGS. 17-19, the incidental benefit of overlay tolerance for formation of TiN dual top electrodes and the effects on memory cell area and uniformity of electrical characteristics of CBRAM cells in accordance with the invention when integrated on a chip will now be discussed. All three of these Figures illustrate a pair of CBRAM memory cell having dimensions in accordance with 48 nm pitch, back end of line (BEOL) ground rules in which word lines 1701 are nominally 25 nm wide. the upper edge 1704 of TaN liner 42 is tuned to 2 nm, leaving a nominal spacing 1702 between edges 1704 of 19 nm. This provides active nanoscale CBRAM memory cells with a nominal area of 40 nm$^2$, each, and an aspect ratio of 10:1 where filament geometry effects dominate area effects on electrical characteristics as discussed above in connection with FIGS. 2 and 3. Dual top electrode 1000 has a length 1705 of 48 nm and a width 1706 of 20 nm and maximum rounding 1707 (shape distortion) of 10 nm radius (one-half the dual top electrode).

Figure 17:
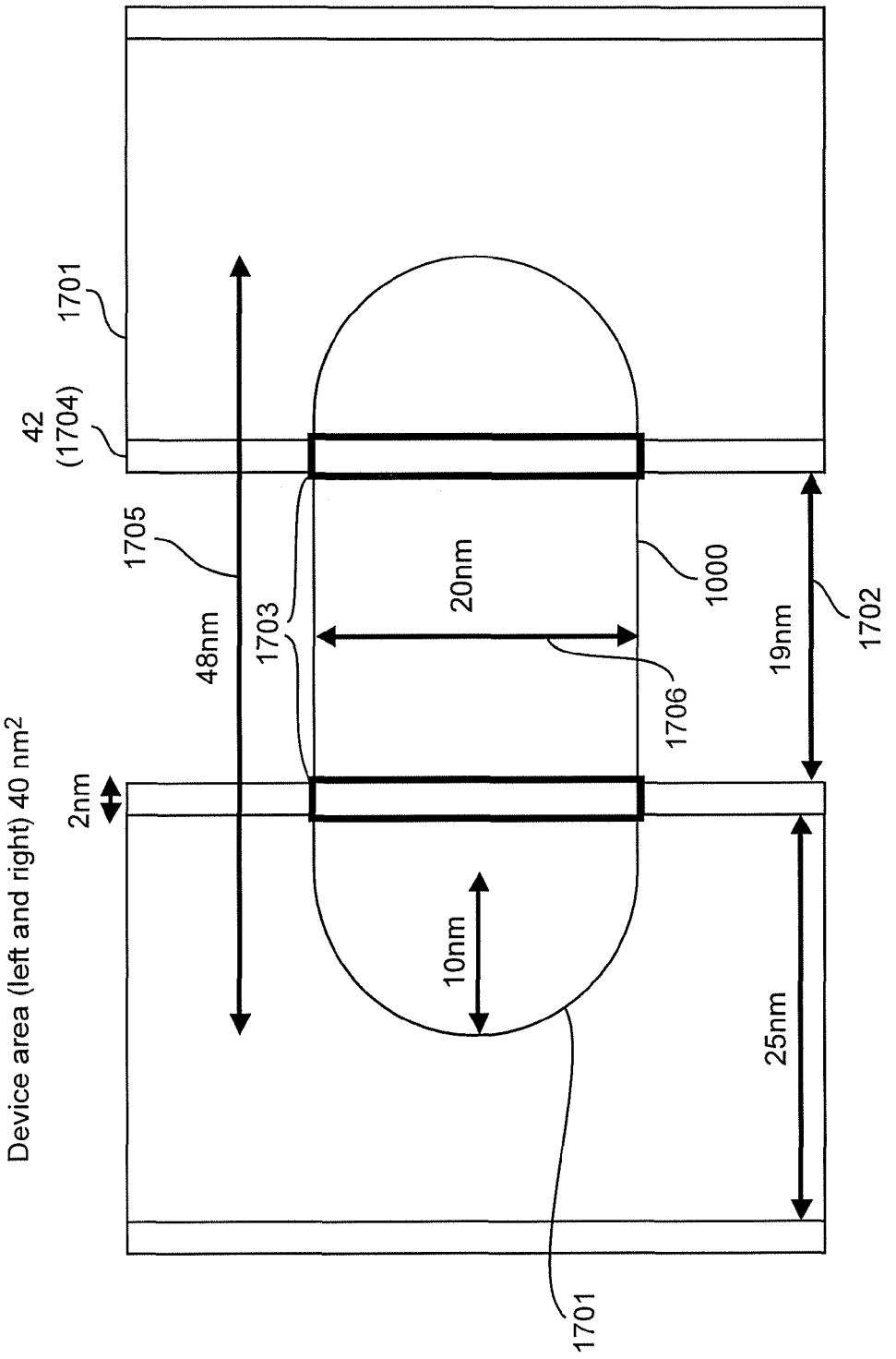
FIGS. 17, 18 and 19 illustrate effects of overlay errors in implementations of the invention having nominal (e.g. zero), best case and worst case overlay errors.

FIG. 17 illustrates a pair of CBRAM cells formed nominally in accordance with the design with no overlay error. It should be appreciated that overlay error in the direction of the bit lines/TaN liner edges 1704 (the vertical direction as shown) will have no effect on CBRAM cell geometry or electrical characteristics since CBRAM cells can be formed at any arbitrary location along the TaN edges 1704. Alteration of area can only occur with overlay error occurring orthogonally thereto (in the horizontal direction, as shown) such that the possible rounding of edges of the TiN dual top electrode and spacers 1100 formed thereon causes reduction of area where they overlap TaN liner edges 1704. It should also be appreciated that overlay error that affects CBRAM memory cell area will affect only one NV memory cell of each memory cell pair and will thus represent a lack of uniformity of CBRAM cells as will now be discussed.

Figure 18:
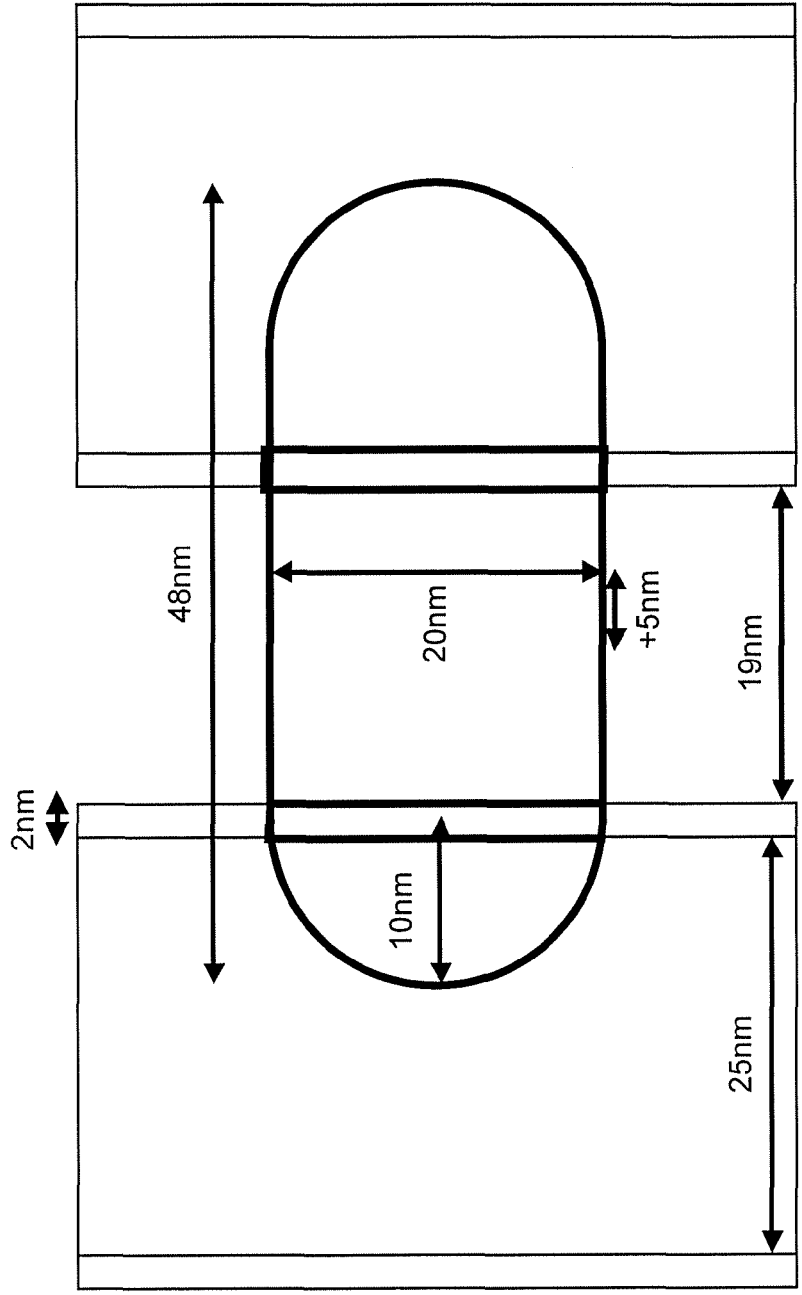

FIG. 18 illustrates the same design of NV memory cell as in FIG. 17 with minimal (5 nm) overlay error. This degree of overlay error is referred to as a "best case" because a lesser degree of overlay error cannot be guaranteed at the present state of the art but may still occur. Statistically, an overlay error of 5 nm is the 3σ point of the distribution of overlay error in manufacture of such structures and is thus still quite rare. That is, a smaller overlay error would only occur in approximately 1% of manufactured devices. As shown in FIG. 18 the rounding of dual top electrode 1000 overlapping TiN edge 1704 causes the memory cell to assume a shape similar to a thin or shallow trapezoid. Since the NV cell area is of high aspect ratio, the change in area is extremely small. Specifically, the area of the NV cell on the left (as illustrated) is reduced to 39.1 nm$^2$ for a difference in memory cell areas of 0.9 nm$^2$ or 2.5% which is negligible.

Figure 19:
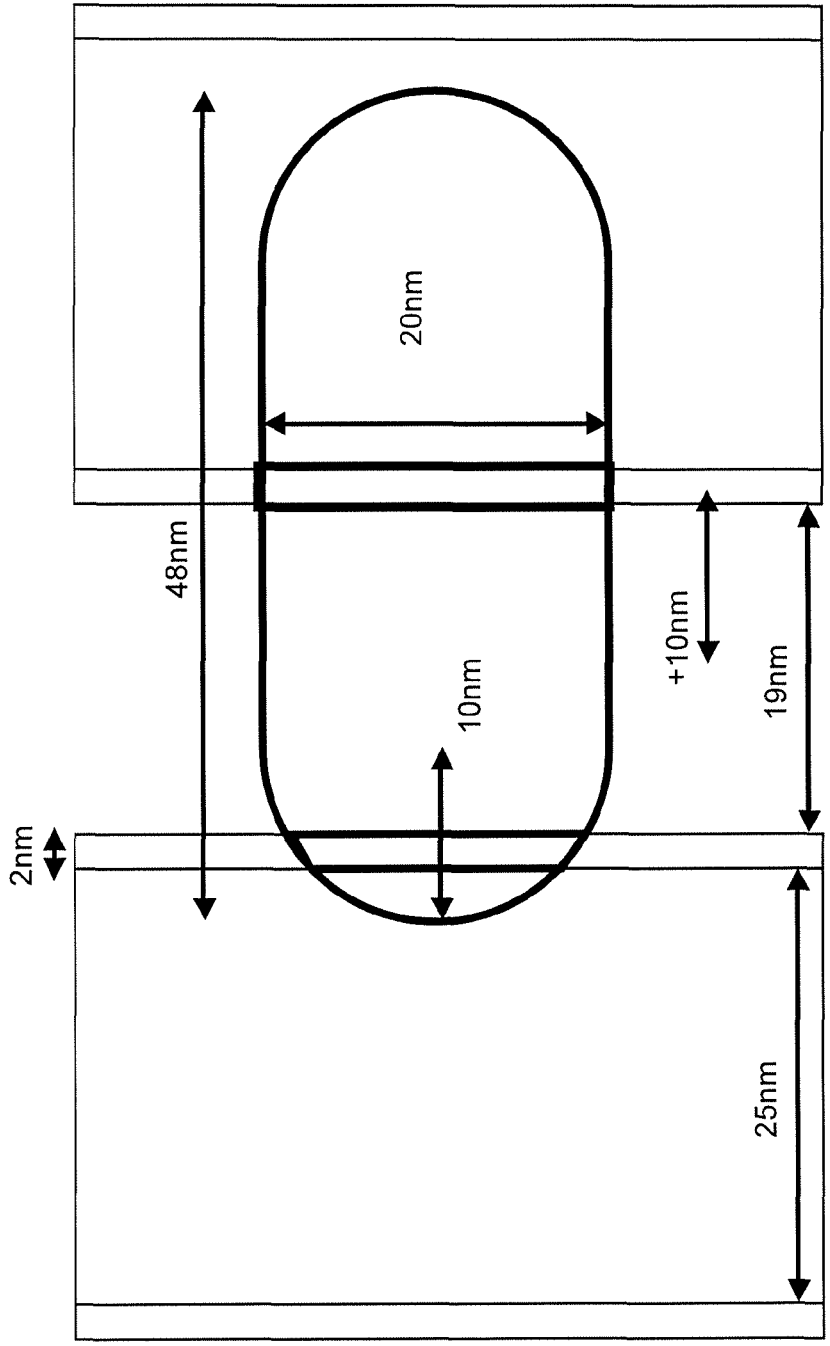

As shown in FIG. 19 the same design of a NV memory cell pair is illustrated with a larger overlay error of 10 nm. This overlay error is referred to as a 'worst case" overlay error since, at the present state of the art, overlay error can be reliably held to 10 nm or less. In this case, the CBRAM memory cell area is reduced to 29.9 nm$^2$, a 25% reduction. Returning to FIG. 2, it is seen that the impact of the difference in area between the nominal design and the worst case overlay error (which will be slightly greater than the difference in area between the best and worst case overlay errors) causes a difference in forming voltage which is very small due to the high aspect ratio of the nanoscale NV cell design even though the area is extremely small. (For purposes of this discussion the term "nanoscale" is defined as any structure having any dimension of less than 100 nm.) Therefore, the NV memory cell design and the preferred CBRAM cell structure in accordance with the invention substantially guarantees good device uniformity on a chip with large process windows for manufacture and lithographic processes while still maintaining good control over and uniformity of electrical characteristics of the NV cells through tuning of the nominal design as discussed above.

In view of the foregoing, it is seen that the invention provides a CBRAM cell device including two sub-lithographic CBRAM cells within a minimum lithographic feature size dual top electrode and a memory array layout capable of providing extreme integration densities as well as providing a maskless mechanism for tuning electrical characteristics and which is highly tolerant of overlay error in both the formation of dual top electrode 1000 and word line geometry. The observed sharp increase in initial filament forming voltage with decreased non-volatile memory cell area is offset by non-volatile memory cell geometry having a high aspect ratio (e.g. greater than 5:1 to make the filament forming voltage very nearly area independent; thus counter-intuitively allowing any desired degree of scaling to small and nanoscale areas to be achieved within current semiconductor manufacturing technology and allowing extremely compact arrays of non-volatile memory cells. The insulator through which the filaments are grown may be formed by deposition of a layer which can be much thinner than a lithographically defined feature and thus two storage cells can be formed at opposing sides of a connection where it crosses another connection; both of which may be of minimum lithographically defined width. The thinness of the insulator layer yields extremely high performance with the time required for initial filament growth as well as setting and resetting operations and access times generally falling within the range of 1 ns to 10 ns and, in some material system such operations can be performed in less than 1 ns. Manufacturing yield can be easily maintained at the present state of the art by being applicable to several different memory cell layouts. Moreover, the contact formation scheme in accordance with the invention is fully generalized applicable to memory cells formed in accordance with other NV memory technologies which include a metal-insulator-metal sandwich structure and capable of being formed through well-understood and reliable BEOL Damascene processing.

While the invention has been described in terms of a single preferred embodiment, those skilled in the art will recognize that the invention can be practiced with modification within the spirit and scope of the appended claims.

We claim:

1. A non-volatile memory device comprising
    a conductive liner in a each of at least two trenches formed in a body of insulating material,
    a conductive dual top electrode overlying an edge of said conductive liner in said at least two trenches and connected to a conductor, and
    a body of dielectric material formed between an edge of said conductive liner and said conductive dual top electrode, said edge of said conductive liner, said body of dielectric material and respective portions of said conductive dual top electrode form two non-volatile memory cells,
    whereby a thickness of said conductive liner determines one dimension of an area of at least one of said two non-volatile memory cells.

2. The non-volatile memory as recited in claim 1, wherein said non-volatile memory cells are conductive bridge memory cells.

3. The non-volatile memory as recited in claim 1, wherein said dielectric material is a Hi-K dielectric material.

4. The non-volatile memory as recited in claim 3, wherein said Hi-K dielectric material is hafnium oxide.

5. The non-volatile memory as recited in claim 1, wherein said conductive liner is tantalum nitride.

6. The non-volatile memory as recited in claim 1, wherein said dual top electrode is titanium nitride.

7. The non-volatile memory as recited in claim 1, further including an insulating spacer formed on a side of said dual top electrode.

8. The non-volatile memory as recited in claim 7, wherein said insulating spacer is formed of silicon Carbon nitride.

9. The non-volatile memory as recited in claim 7, wherein a thickness of said insulating spacer is used to control dimensions of said body of dielectric material.

10. The non-volatile memory as recited in claim 1, wherein said two non-volatile memory cells each have an area of 40 nm$^2$ or less.

11. The non-volatile memory as recited in claim 10, wherein said two non-volatile memory cells have an aspect ratio of at least 5:1.

12. The non-volatile memory as recited in claim 1, wherein said two non-volatile memory cells have an aspect ratio of at least 5:1.

13. The non-volatile memory as recited in claim 1, wherein areas of said two non-volatile memory cells are unequal.

14. The non-volatile memory as recited in claim 1, wherein said conductor is an extension protruding orthogonally to a length of connections crossing said trenches.

15. The non-volatile memory as recited in claim 14, wherein pairs of said connections have extensions extending in opposite directions.

16. The non-volatile memory as recited in claim 14, wherein pairs of said connections have extensions extending in the same direction.

17. The non-volatile memory as recited in claim 14, wherein pairs of said connections have extensions extending in opposite directions and interleaved such that pairs of said non-volatile memory cells are arrayed in lines.

* * * * *